United States Patent [19]
Hoffman

[11] Patent Number: 5,506,373
[45] Date of Patent: Apr. 9, 1996

[54] ELECTRONIC MODULE ENCLOSURE

[75] Inventor: Arden L. Hoffman, Monroeville, Ind.

[73] Assignee: Magnavox Electronic Systems Company, Fort Wayne, Ind.

[21] Appl. No.: 90,349

[22] Filed: Jul. 9, 1993

[51] Int. Cl.⁶ .................................................. H05K 9/00
[52] U.S. Cl. ...................................... 174/35 GC; 361/818
[58] Field of Search ........................... 174/35 R, 35 C, 174/35 GC, 35 MS; 361/816, 818, 719, 720, 721, 726, 727, 728, 732, 736, 740, 741, 747, 752, 753, 759, 791, 799, 800, 801, 802

[56] References Cited

U.S. PATENT DOCUMENTS

| | | | |
|---|---|---|---|
| 4,499,523 | 2/1985 | Gillett et al. | 361/693 |
| 4,656,559 | 4/1987 | Fathi | 361/721 |
| 4,658,334 | 4/1987 | McSparran et al. | 174/35 R X |
| 4,810,589 | 3/1989 | Kuwamoto et al. | 174/35 MS X |
| 4,811,165 | 3/1989 | Currier et al. | 439/76 X |
| 4,831,498 | 5/1989 | Baba | 174/35 GC X |
| 5,070,430 | 12/1991 | Meusel et al. | 361/775 |
| 5,095,177 | 3/1992 | Johnson | 174/35 R |
| 5,323,299 | 6/1994 | Weber | 174/35 R X |
| 5,333,100 | 7/1994 | Anhalt et al. | 174/35 R X |
| 5,339,222 | 8/1994 | Simmons et al. | 174/35 R X |
| 5,353,201 | 10/1994 | Maeda | 174/35 R X |
| 5,386,340 | 1/1995 | Kurz | 361/737 |
| 5,387,764 | 2/1995 | Blom et al. | 174/35 R X |
| 5,392,197 | 2/1995 | Cuntz et al. | 361/818 |

*Primary Examiner*—Kristine L. Kincaid
*Assistant Examiner*—Christopher Horgan
*Attorney, Agent, or Firm*—Richard T. Seeger; John H. Crozier

[57] ABSTRACT

In a preferred embodiment, an enclosure for an electronic module containing an electronic component having upper and lower surfaces, the enclosure including: a top cover shield overlying, and substantially covering, in closely spaced relationship, the upper surface of the electronic component; a bottom cover shield underlying, and substantially covering, in closely spaced relationship, the lower surface of the electronic component; and the top and bottom cover shields being cojoined so as to substantially enclose the electronic component.

19 Claims, 3 Drawing Sheets

5,506,373

ELECTRONIC MODULE ENCLOSURE

BACKGROUND OF THE INVENTION

1. Field of the Invention

The present invention relates to shielding and enclosures for electronic modules generally and, more particularly, but not by way of limitation, to a novel protective enclosure for an electronic module which enclosure also serves as an EMI/RFI shield and an effective heat transfer component.

2. Background Art

While the present invention is described with reference to an Enhanced Manpack Unified Terminal (EMUT), the invention is applicable, as well, to any electronic device in which the features thereof are advantageous.

Shielding of components from electromagnetic interference (EMI) and radio frequency interference (RFI) is especially critical in a EMUT, due to the fact that the device has a high power output transmitter, a very sensitive receiver, and very precise digital circuits in a common chassis.

A typical shield for an electronic component of such a device, a printed circuit card assembly (CCA), for example, comprises top and bottom metal plates that are attached to rails along the edges of the CCA by soldering. Such an arrangement makes servicing of the CCA difficult.

A particular problem with EMUTs is that heat removal is a concern throughout the devices, not just a localized concern as is the case in many electronic devices.

It is, of course, desirable that electronic components be thoroughly protected from physical damage while in use as well as during replacement.

Accordingly, it is a principal object of the present invention to provide a protective shield for an electronic component, such as a CCA, that thoroughly protects the CCA from physical damage.

It if a further object of the invention to provide such a shield that affords shielding from EMI/RFI.

It is an additional object of the invention to provide such a shield that is easily removable for servicing of the electronic component.

It is another object of the invention to provide such a shield that enhances grounding of the component and promotes heat transfer from the component.

It is yet a further object of the invention to provide such a shield that improves the dynamic response of the CCA, thus reducing harmful stresses on the CCA.

Other objects of the present invention, as well as particular features, elements, and advantages thereof, will be elucidated in, or be apparent from, the following description and the accompanying drawing figures.

SUMMARY OF THE INVENTION

The present invention achieves the above objects, among others, by providing, in a preferred embodiment, an enclosure for an electronic module containing an electronic component having upper and lower surfaces, said enclosure comprising: a top cover shield overlying, and substantially covering, in closely spaced relationship, the upper surface of said electronic component; a bottom cover shield underlying, and substantially covering, in closely spaced relationship, the lower surface of said electronic component; and said top and bottom cover shields being cojoined so as to substantially enclose said electronic component.

BRIEF DESCRIPTION OF THE DRAWING

Understanding of the present invention and the various aspects thereof will be facilitated by reference to the accompanying drawing figures, submitted for purposes of illustration only and not intended to define the scope of the invention, on which.

DETAILED DESCRIPTION OF THE PREFERRED EMBODIMENTS

Figure 1:
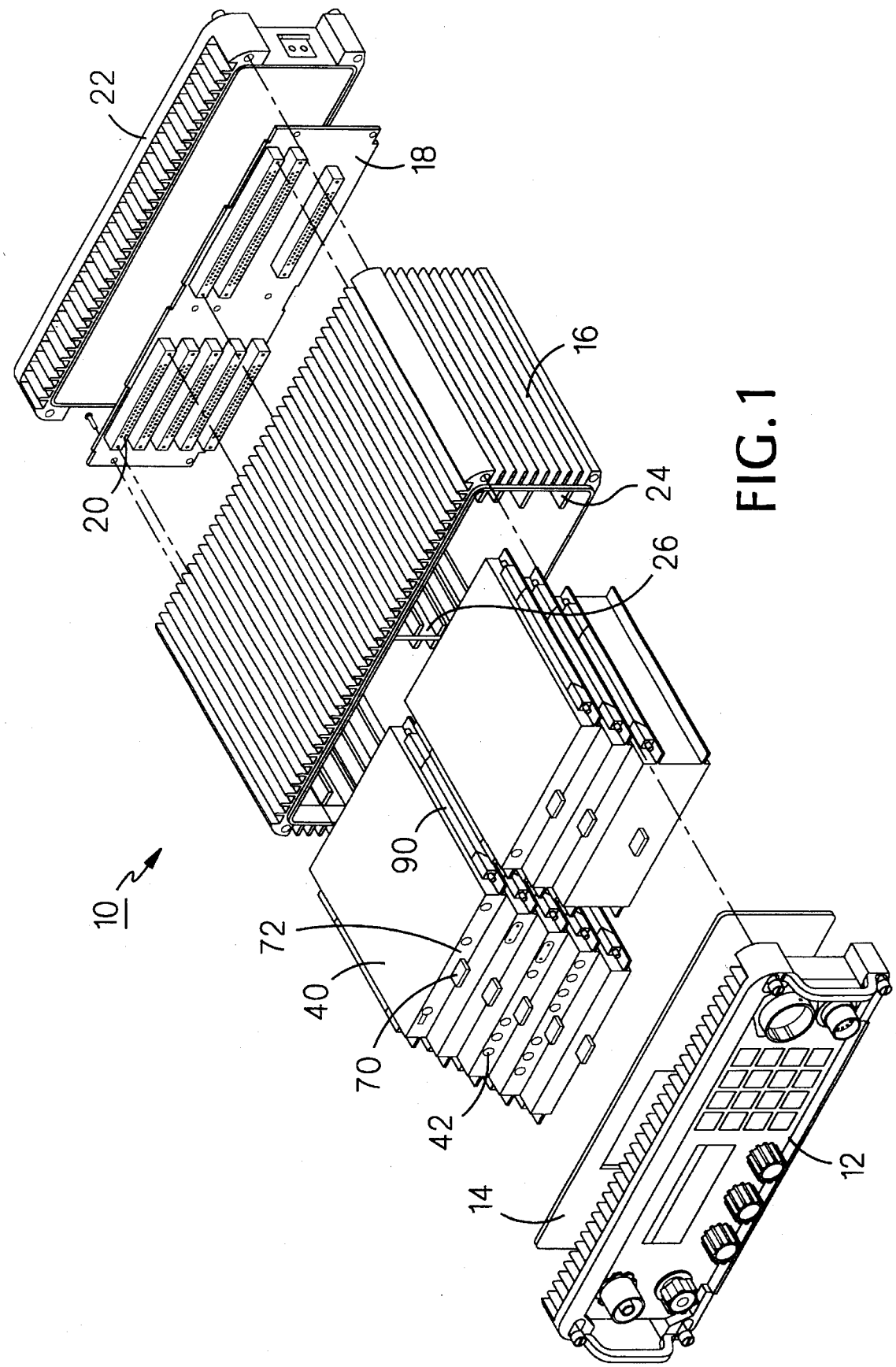
FIG. 1 is an exploded perspective view of an electronic device having therein electronic components shielded according to the present invention.

Reference should now be made to the drawing figures, on which similar or identical elements are given consistent identifying numerals throughout the various figures thereof, and on which parenthetical references to figure numbers direct the reader to the view(s) on which the element(s) being described is (are) best seen, although the element(s) may be seen also on other views.

FIG. 1 illustrates an exemplary electronic device, generally indicated by the reference numeral 10, which may be assumed to be an EMUT. Device 10 includes a typical front control panel 12 behind which is a CCA 14 which contains a conventional display panel and circuitry interfacing with the front control panel. Front control panel 12 is attachable to the front opening of an open, rectangular, finned chassis/heat sink 16. At the rear of chassis/heat sink 16 is a mother board 18 to which are mounted a plurality of modular connectors, as at 20. Attachable to the rear opening of chassis/heat sink 16 is a rear panel 22. Interiorly of chassis/heat sink 16 is a plurality of parallel, spaced apart, horizontal rails disposed along the sides of the chassis/heat sink and along either side of a central, vertical panel 26 running the length of the chassis/heat sink.

It can be seen that front control panel 12, chassis/heat sink 16, and rear panel 22, when assembled, comprise a closed, rectilinear body for device 10.

A plurality of shielded component modules, as at 40, are insertable in chassis/heat sink 16 in engagement with rails 24. Coaxial connectors, as at 42, are provided in the front face of some of modules 40 to permit intermodule connection with RF cables (not shown). CCA 14 is connected to mother board 18 by means of a conventional flat cable (not shown) running under modules 40 in chassis/heat sink 16 and direct connections (not shown) may also be provided between the CCA and the modules.

Figure 2:
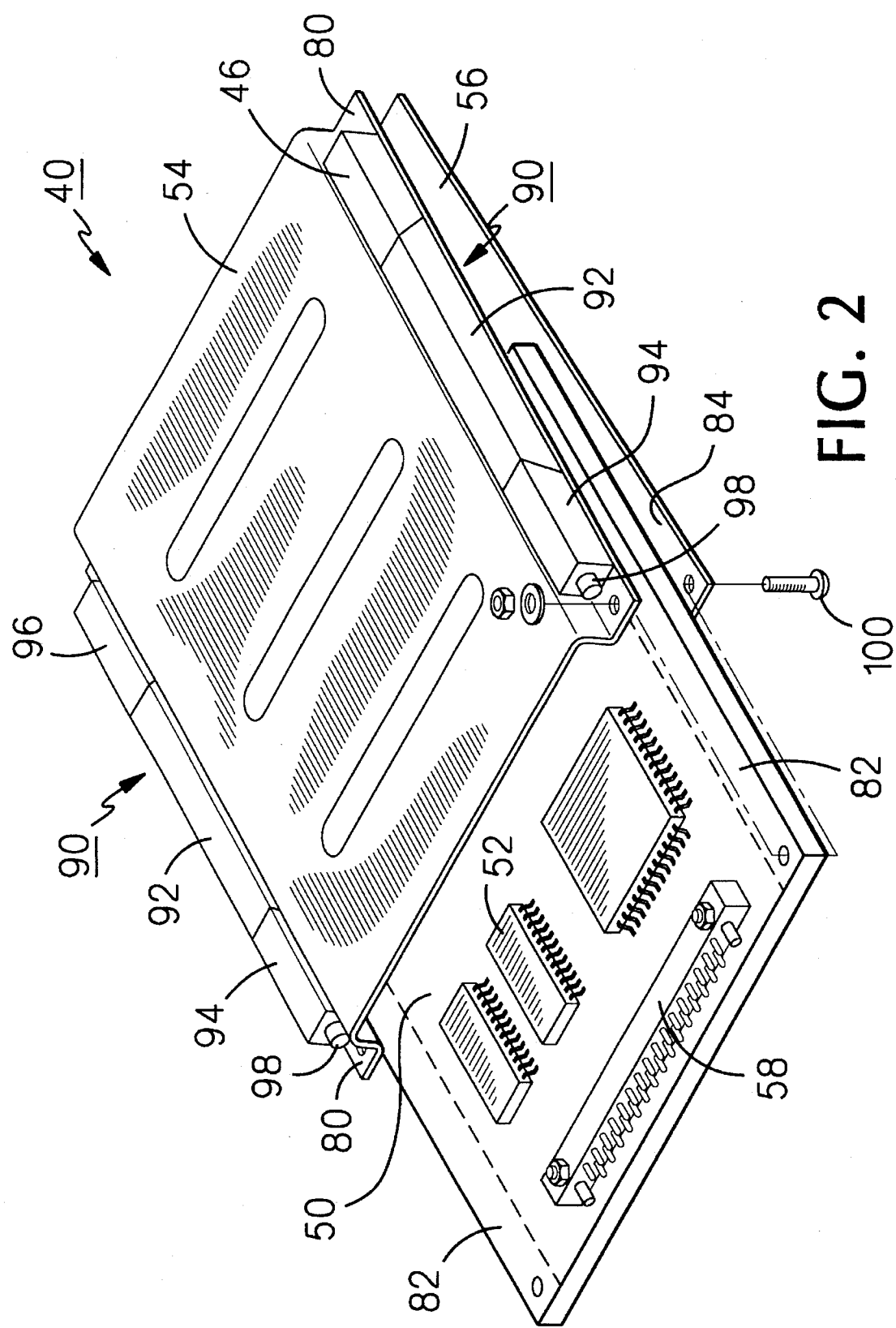
FIG. 2 is a perspective view of a CCA partially inserted in the shield of the present invention.

Referring now primarily to FIG. 2, the construction of an electronic module 40 is illustrated. Here, a CCA 50 having top side active components, as at 52, is shown partially inserted between top and bottom cover EMI/RFI shields 54 and 56, respectively. Top and bottom cover shields are monolithic and are hingedly joined by the flexibility of the material of which they are constructed.

When CCA 50 is fully inserted between cover shields 54 and 56 and the cover shields closed, the CCA will be thoroughly physically protected and shielded from EMI/RFI. Pins of a connector 58 mounted on CCA 50 are protectively disposed slightly inwardly from the open, rear face of module 40 when the module is assembled, the pins engaging one of modular connectors 20 (FIG. 1) on mother board 18.

Referring back to FIG. 1, a tab 70, which is created as an extension of CCA 50 (FIG. 2), extends through closed, front surface 72 of module 40 for support thereby. When module 40 is inserted in chassis/heat sink 16 and the pins of connector 58 (FIG. 2) inserted into a modular connector 20, CCA 50 will be supported between the modular connector and front surface 72. Also referring to FIG. 1, it should be noted that lower right module 40 is a triple module having therein three CCAs 50.

Front surface 72 also provides a convenient surface for the placement thereon of identifying indicia for module 40 and coaxial connectors 42.

Referring again to FIG. 2, top cover shield includes two outwardly facing flanges 80 extending horizontally therefrom along the side edges thereof. Ground plane areas 82 are provided along the edges of the top surface of CCA 50 and similar ground plane areas (not shown) are provided along the edges of the lower surface of CCA 50. Bottom cover shield 56 includes two outwardly facing flanges 84 (only one visible on FIG. 2) extending horizontally therefrom along the side edges thereof. When top and bottom cover shields 54 and 56 are closed, flanges 80 will engage ground planes 82 and flanges 84 will engage the ground planes on the lower surface of CCA 50.

A pair of screw fasteners 100 (only one of pair shown on FIG. 2) is used to secure top and bottom cover shields to CCA 50 when 40 is not installed in chassis/heat sink 16 (FIG. 1).

Figure 3:
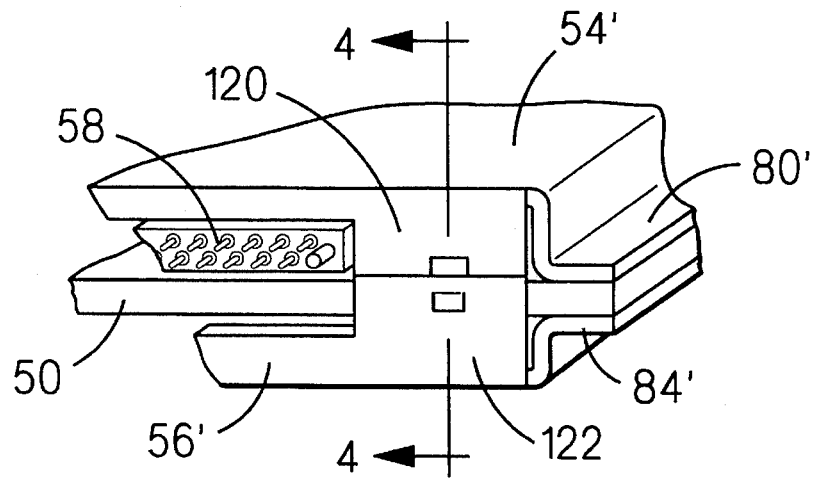
FIG. 3 is a fragmentary, perspective view of an alternative embodiment of the present invention.
Figure 4:
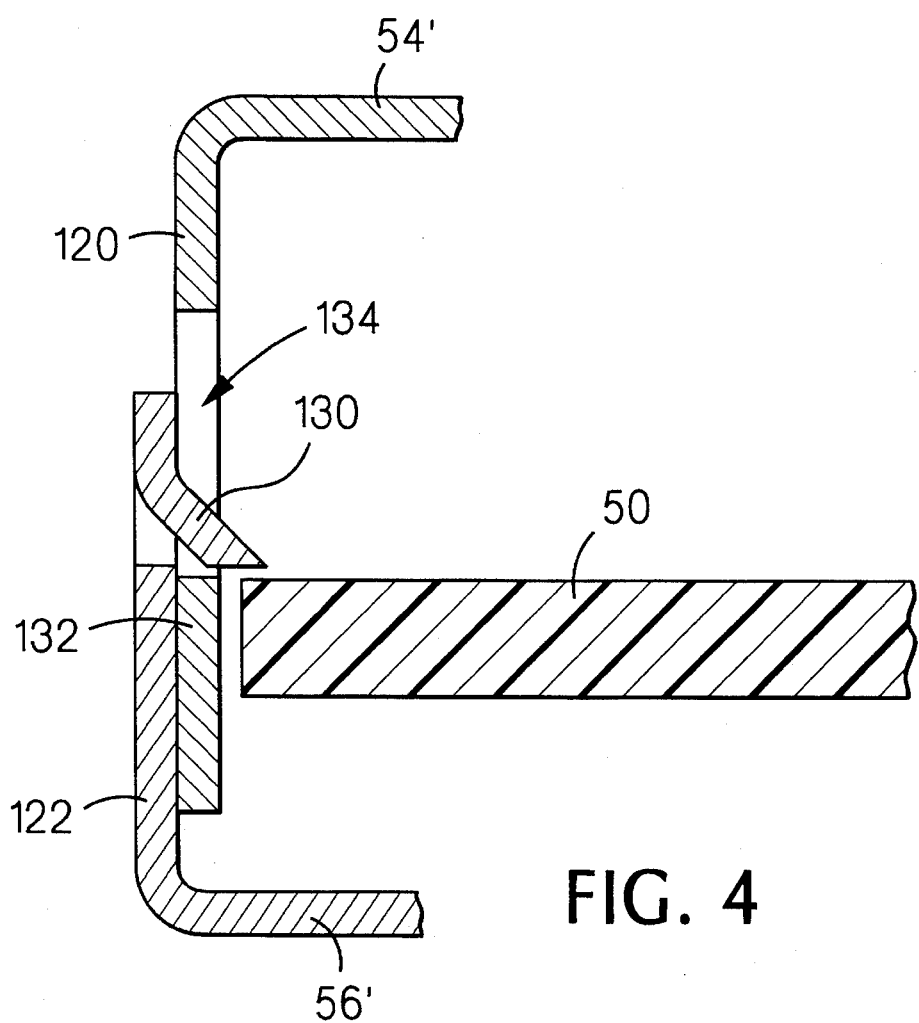
FIG. 4 is a fragmentary, cross-sectional view taken along line "4–4" of FIG. 3.

In order to avoid the use of additional parts in module 40, a snap together arrangement may be employed as illustrated on FIGS. 3 and 4. Here, top and bottom shield covers 54' and 56', respectively, have short, vertical, rear end walls 120 and 122, respectively, extending inwardly from the edges of the shield covers. It will be understood that a similar pair of rear end walls will extend inwardly from the other edges of top and bottom shield covers 54' and 56'. The snap together feature of this embodiment is shown most clearly in FIG. 4. An inwardly facing tab 130 formed in end wall 122 engages the bottom 132 of an opening 134 defined in end wall 120. Assembly is accomplished by forcing end walls 120 and 122 past each other with slight elastic deformation thereof until tab 130 snaps into the position shown.

With reference to FIG. 2, commercially available locking retainers, generally indicated by the reference numeral 90, are disposed on top of flanges 80. Such locking retainers are marketed, for example, by EG&G Birtcher. Each locking retainer 90 includes a center shell section 92 fixedly attached to top cover shield 54 with a high bond strength, high temperature, pressure sensitive acrylic transfer adhesive, such as VHB F9473PC as furnished by 3M Corporation. Two wedge members 94 and 96 are drawable into center shell section 92 by means of a screw 98 disposed between the wedge members. As wedge members 94 and 96 are drawn into outer shell member 92, the wedge member expands.

Referring again to FIG. 1, when a module 40 is inserted into chassis/heat sink 16, locking retainers 90 thereon will be in contact with either the inner surface of the top of the chassis/heat sink or a rail 24 therein. Then, tightening of screw 98 (FIG. 2) will draw wedge members 94 and 96 into outer shell member 92, causing the outer shell member to expand, thus wedging module 40 in place. This action increases the electrical bond between top and bottom cover shields 54 and 56 and ground plane 82 and the ground planes on the lower surface of CCA 50 and chassis/heat sink 16.

Having top and bottom cover shields 54 and 56 of each module 40 in contact with each other and with the inner surfaces of chassis/heat sink 16 provides enhanced conductive heat transfer from the entire surfaces of the modules through the chassis/heat sink to the ambient air.

It can be seen that modules 40 are thoroughly physically protected by top and bottom cover shields 54 and 56. When a user of device 10 detects a possible malfunction of one of modules 40 through an on-board testing program, that module may be easily removed from the device and given further testing, with little danger of the internal components of the module being damaged.

Top and bottom cover shields may be constructed of any suitable shielding material and, for EMI/RFI shielding, cold rolled 1018 steel is the preferred material. If magnetic shielding is important, a mu-metal material may be employed. If the greater concern is with heat transfer, copper shielding may be employed.

It has been found that the combination of the elements of the present invention increases the natural frequency of CCA 50 and decreases the transmissibility of the CCA.

It will thus be seen that the objects set forth above, among those elucidated in, or made apparent from, the preceding description, are efficiently attained and, since certain changes may be made in the above construction without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

I claim:

1. An enclosure for an electronic module containing a printed circuit card assembly having upper and lower surfaces, said enclosure comprising:

(a) a top cover shield overlying, and substantially covering, in closely spaced relationship, the upper surface of said printed circuit card assembly;

(b) a bottom cover shield underlying, and substantially covering, in closely spaced relationship, the lower surface of said printed circuit card assembly; and (c) said top and bottom cover shields being joined to said printed circuit card assembly at edges of said printed circuit cord assembly so as to substantially enclose said printed circuit card assembly.

2. An enclosure, as defined in claim 1, wherein the material of which said top and bottom cover shields is constructed is an EMI/RFI shielding material.

3. An enclosure, as defined in claim 2, wherein said shielding material is selected from the group consisting of steel, mu-metal, and copper.

4. An enclosure, as defined in claim 2, wherein said shielding material is cold rolled 1018 steel.

5. An enclosure, as defined in claim 1, wherein said enclosure is adapted to be inserted in a chassis of an electronic device and said enclosure includes means associated therewith to firmly secure said enclosure in said chassis such as to enhance an electrical bond between said enclosure and said chassis.

6. An enclosure, as defined in claim 5, wherein said means to firmly secure comprises at least one locking retainer mounted on said enclosure.

7. An enclosure, as defined in claim 1, wherein said printed circuit card assembly has an extended tab created at a first end thereof for insertion through and support by an end of said enclosure.

8. An enclosure, as defined in claim 7, wherein:
   (a) said enclosure is adapted to be inserted in a chassis of an electronic device; and
   (b) said printed circuit card assembly has a connector mounted at a second end thereof opposite said first end for connection to a connector mounted in said chassis, such that said printed circuit card assembly is supported by said end of said enclosure and said connector mounted in said chassis.

9. An enclosure for an electronic module containing an electronic component having upper and lower surfaces, with ground planes defined along both of pairs of opposite edges of said upper and lower surfaces, said enclosure comprising:
   (a) a top cover shield overlying, and substantially covering, in closely spaced relationship, the upper surface of said electronic component; p1 (b) said top cover shield having a pair of outwardly facing flanges extending from opposite edges thereof in proximity to said ground planes of said upper surface;
   (c) a bottom cover shield underlying, and substantially covering, in closely spaced relationship, the lower surface of said electronic component;
   (d) said bottom cover shield having a pair of outwardly facing flanges extending from opposite edges thereof in proximity to said ground planes of said bottom surface;
   (e) said top and bottom cover shields being joined to said electronic component at said ground planes of said upper and bottom surfaces, respectively, and in contact therewith; and
   (f) said enclosure being adapted to be inserted in a chassis of an electronic device.

10. An enclosure, as defined in claim 9, wherein said chassis includes at least a pair of parallel opposing spaced apart rails therein such that said flanges of said top and bottom cover shields engage said rails when said enclosure is disposed in said chassis.

11. An enclosure, as defined in claim 10, wherein said enclosure includes means associated therewith to firmly secure said enclosure in said chassis such as to enhance an electrical bond between said ground planes, said flanges, and said chassis.

12. An enclosure, as defined in claim 11, wherein said means to firmly secure comprises locking retainers mounted on said flanges and bearing against said rails and another pair of elements within said chassis.

13. An enclosure, as defined in claim 9, wherein said electronic component is a printed circuit card assembly.

14. An enclosure, as defined in claim 9, wherein the material of which said top and bottom cover shields is constructed is an EMI/RFI shielding material.

15. An enclosure, as defined in claim 14, wherein said shielding material is selected from the group consisting of steel, mu-metal, and copper.

16. An enclosure, as defined in claim 14, wherein said shielding material is cold rolled 1018 steel.

17. An enclosure, as defined in claim 12, wherein said locking retainers are fixedly attached to said flanges of at least one of said top and bottom cover shields by means of an adhesive.

18. An enclosures, as defined in claim 17, wherein said adhesive is a high bond strength, high temperature, pressure sensitive, acrylic transfer adhesive.

19. An enclosure, as defined in claim 18, wherein the elements of said enclosure are arranged so as to increase the natural frequency of said printed circuit card and to decrease transmissibility of said printed circuit card.

* * * * *